(12) United States Patent
Lai et al.

(10) Patent No.: US 10,756,706 B2
(45) Date of Patent: Aug. 25, 2020

(54) PWM FILTER CIRCUIT AND RELATED CONTROL SYSTEM

(71) Applicant: Lextar Electronics Corporation, Hsinchu (TW)

(72) Inventors: Tsung-Yuan Lai, Taichung (TW); Chien-Shen Hung, Miaoli County (TW); Hsien-Chih Ho, Hsinchu County (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 194 days.

(21) Appl. No.: 16/109,771

(22) Filed: Aug. 23, 2018

(65) Prior Publication Data

US 2019/0199326 A1    Jun. 27, 2019

(30) Foreign Application Priority Data

Dec. 22, 2017    (TW) .............................. 106145362 A (51) Int. Cl.
*H03H 11/04*     (2006.01)
*H03K 7/08*      (2006.01)
*H03K 9/08*      (2006.01)

(52) U.S. Cl.
CPC ............... *H03H 11/04* (2013.01); *H03K 7/08* (2013.01); *H03K 9/08* (2013.01)

(58) Field of Classification Search
CPC ............. H03H 11/04; H03K 7/08; H03K 9/08
See application file for complete search history.

(56) References Cited

U.S. PATENT DOCUMENTS

| 7,646,162 B2 | 1/2010 | Ma |
| 2017/0149271 A1 | 5/2017 | Wang et al. |

FOREIGN PATENT DOCUMENTS

| CN | 1741364 A | 3/2006 |
| CN | 1913333 A | 2/2007 |
| CN | 101179879 A | 5/2008 |
| CN | 206313746 U | 7/2017 |
| TW | I560679 B | 12/2016 |

*Primary Examiner* — Robert L Deberadinis
(74) *Attorney, Agent, or Firm* — CKC & Partners Co., LLC (57) ABSTRACT

A filter circuit comprises a resistor-capacitor (RC) circuit, a comparator circuit, and an output control circuit. The RC circuit is configured to generate a ripple voltage according to the PWM signal. The comparator circuit couples with the RC circuit, and is configured to compare the ripple voltage with a first reference voltage, and output a switch signal according to a comparison result. The output control circuit couples with the comparator circuit and the RC circuit, and is configured to generate an output signal according to the switch signal and the PWM signal. When a duty ratio of the PWM signal is larger than a predetermined threshold value, the output signal is corresponding to the PWM signal. When the duty ratio of the PWM signal is smaller than the predetermined threshold value, the output signal is not corresponding to the PWM signal.

10 Claims, 11 Drawing Sheets

PWM FILTER CIRCUIT AND RELATED CONTROL SYSTEM

CROSS-REFERENCE TO RELATED APPLICATION

This application claims priority to Taiwan Application Serial Number 106145362, filed Dec. 22, 2017, which is herein incorporated by reference in its entirety.

BACKGROUND

Field of Invention

The present disclosure generally relates to a PWM filter circuit and related control system. More particularly, the present disclosure relates to a filter circuit and control system configured to filter a PWM signal based on the duty ratio of the PWM signal.

Description of Related Art

A traditional voltage comparison circuit determines an output signal by comparing an input signal with a predetermined threshold voltage. For example, when a PWM signal having a 5 V peak value and a 0 V valley value is inputted into a traditional voltage comparison circuit having a 3 V predetermined threshold voltage, the voltage comparison circuit correspondingly outputs the PWM signal having the 5 V peak value and the 0 V valley value. When another PWM signal having a 2 V peak value and a 0 V valley value is inputted into the voltage comparison circuit, the voltage comparison circuit outputs a constant 0 V voltage, rather than outputs the another PWM signal.

However, the traditional voltage comparison circuit cannot determine the output signal according to the variation of the duty ratio of the PWM signal. For example, no matter how the duty ratio of the aforementioned another PWM signal having the 2 V peak value and the 0 V valley value changes, the voltage comparison circuit would remain outputting the constant 0 V voltage. As a result, the traditional voltage comparison circuit restricts the usage of the PWM signal.

SUMMARY

An example embodiment of a filter circuit suited for filtering a PWM signal is disclosed. The filter circuit comprises a resistor-capacitor (RC) circuit, a comparator circuit, and an output control circuit. The RC circuit is configured to generate a ripple voltage according to the PWM signal. The comparator circuit couples with the RC circuit, and is configured to compare the ripple voltage with a first reference voltage, and to output a switch signal according to a comparison result. The output control circuit couples with the comparator circuit and the RC circuit, and is configured to generate an output signal according to the switch signal and the PWM signal. When a duty ratio of the PWM signal is larger than a predetermined threshold value, a waveform of the output signal is corresponding to the PWM signal, and when the duty ratio of the PWM signal is smaller than the predetermined threshold value, the waveform of the output signal is not corresponding to the PWM signal.

Another example embodiment of a control system is disclosed. The control system comprises a control device, multiple filter circuits, and multiple output devices. The control device is configured to generate a PWM signal. The multiple filter circuits are configured to couple with the control device, wherein each of the multiple filter circuits is configured to receive and filter the PWM signal. Each of the multiple output devices is configured to correspondingly couple with one of the multiple filter circuits, and to conduct operations according to the PWM signal. Each of the multiple filter circuits has a predetermined threshold value, the filter circuit compares a duty ratio of the PWM signal with the predetermined threshold value, when the duty ratio of the PWM signal is larger than the predetermined threshold value, the filter circuit outputs the PWM signal to one of the multiple output devices correspondingly couples with the filter circuit, and when the duty ratio of the PWM signal is smaller than the predetermined threshold value, the filter circuit does not output the PWM signal to the one of the multiple output devices correspondingly couples with the filter circuit.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
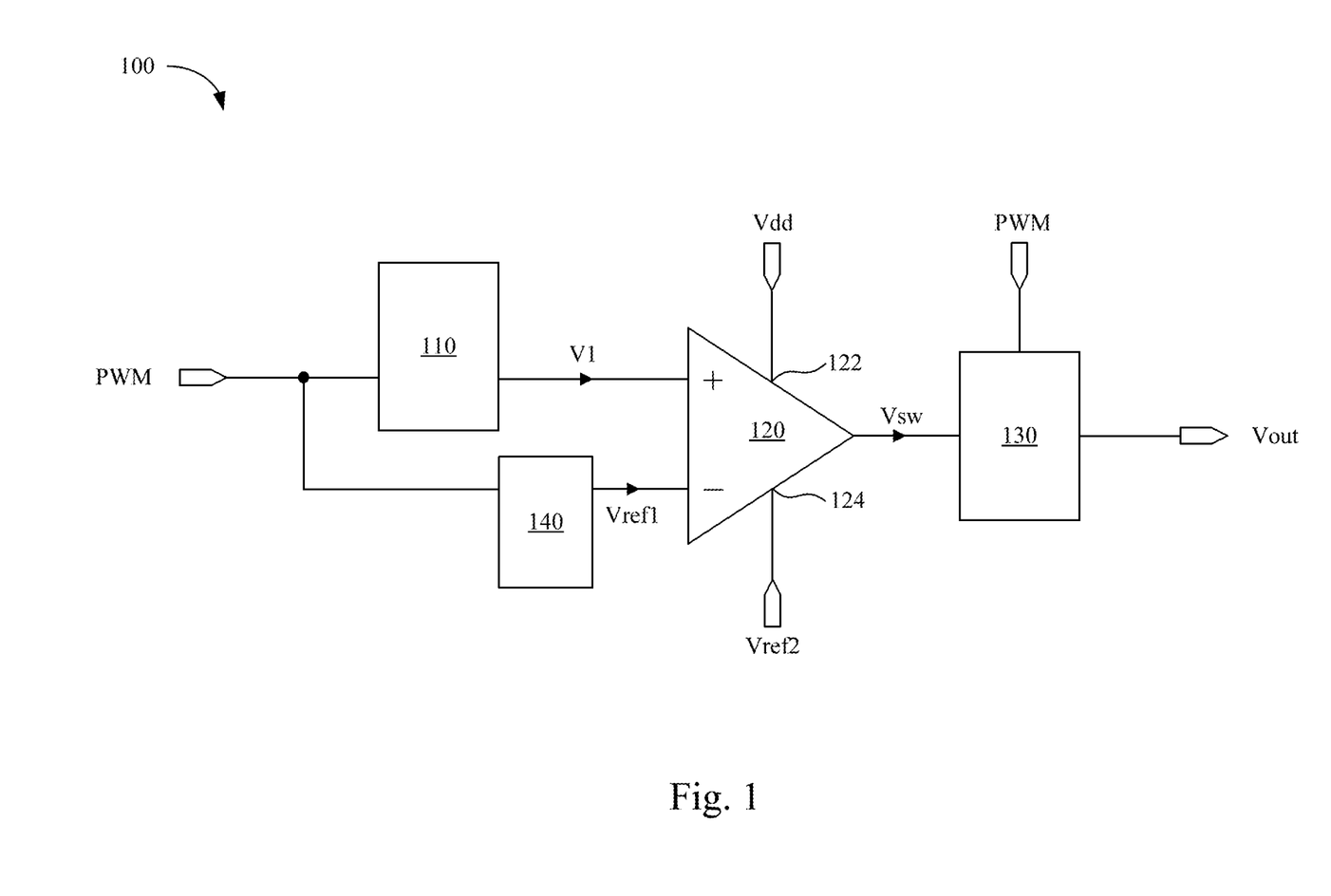
FIG. 1 is a simplified functional block diagram of a filter circuit according to an embodiment of the present disclosure.

FIG. 1 is a simplified functional block diagram of a filter circuit 100 according to an embodiment of the present disclosure. The filter circuit 100 comprises a resistor-capacitor (RC) circuit 110, a comparator circuit 120, an output control circuit 130, and a reference voltage generating circuit 140. A non-inverting input node of the comparator circuit 120 couples with the RC circuit 110, an inverting input node of the comparator circuit 120 couples with the reference voltage generating circuit 140, and an output node of the comparator circuit 120 couples with the output control circuit 130.

The RC circuit 110 is configured to transform the PWM signal to a ripple voltage V1, wherein a difference between the peak value and the valley value of the PWM signal is larger than a difference between the peak value and the valley value of the ripple voltage V1. The reference voltage generating circuit 140 is configured to generate a first reference voltage Vref1 according to the PWM signal. The comparator circuit 120 is configured to compare the ripple voltage V1 with the first reference voltage Vref1, and output a switch signal Vsw according to the comparison result. The output control circuit 130 is configured to output an output signal Vout according to the switch signal Vsw and the PWM signal. It is worth mentioning that the filter circuit 100 may filter the PWM signal based on the duty ratio of the PWM signal.

In detail, when the duty ratio of the PWM signal is larger than a predetermined threshold value, the ripple voltage V1 would be larger than the first reference voltage Vref1. In this situation, the switch signal Vsw outputted by the comparator circuit 120 is corresponding to a power supply voltage Vdd, wherein the power supply voltage Vdd is received by a positive power node 122 of the comparator circuit 120. As a result, the output signal Vout outputted by the output control circuit 130 is corresponding to the PWM signal (e.g., the duty ratio of the output signal Vout is the same as the duty ratio of the PWM signal).

On the contrary, when the duty ratio of the PWM signal is smaller than the predetermined threshold value, the ripple voltage V1 would be smaller than the first reference voltage Vref1. In this situation, the switch signal Vsw outputted by the comparator circuit 120 is corresponding to a second reference voltage Vref2, wherein the second reference voltage Vref2 is received by a negative power node 124 of the comparator circuit 120. As a result, the output signal Vout outputted by the output control circuit 130 would not be corresponding to the PWM signal. In practice, the second reference voltage Vref2 may be a grounding voltage.

Figure 2:
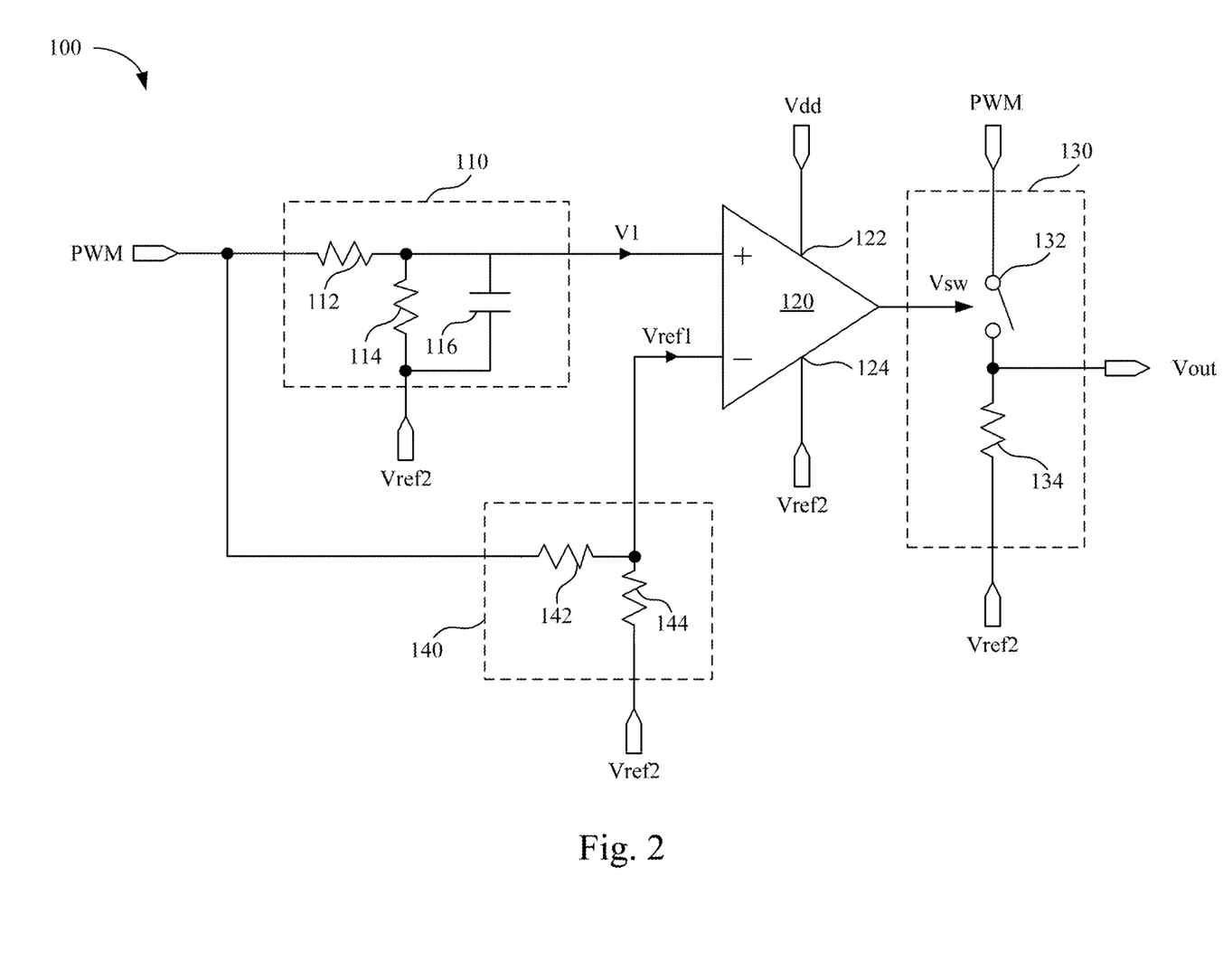
FIG. 2 is a functional block diagram for further illustrating the circuit structure of the filter circuit of FIG. 1 according to an embodiment of the present disclosure.

FIG. 2 is a functional block diagram for further illustrating the circuit structure of the filter circuit 100 of FIG. 1 according to an embodiment of the present disclosure. As shown in FIG. 2, the RC circuit 110 comprises a first resistor 112, a second resistor 114, and a capacitor 116. The first resistor 112 comprises a first node and second node, wherein the first node of the first resistor 112 is configured to receive the PWM signal, and the second node of the first resistor 112 couples with a first node of the second resistor 114. A second node of the second resistor 114 is configured to receive the second reference voltage Vref2. The capacitor 116 comprises a first node and a second node, the first node of the capacitor 116 couples with the second node of the first resistor 112 and the non-inverting input node of the comparator circuit 120, and the second node of the capacitor 116 is configured to receive the second reference voltage Vref2.

The number of the capacitor of the RC circuit 110 is not restricted by this embodiment. In some embodiment that requires a larger capacitance, the capacitor 116 may be replaced by a capacitor array formed by multiple capacitors coupling with each other in a parallel connection.

The output control circuit 130 comprises an output switch 132 and a third resistor 134. The output switch 132 comprises a first node, a second node, and a control node. The first node of the output switch 132 is configured to receive the PWM signal, the second node of the output switch 132 is configured to generate the output signal Vout, and the control node of the output switch 132 is configured to receive the switch signal Vsw. The third resistor 134 comprises a first node and a second node, wherein the first node of the third resistor 134 couples with the second node of the output switch 132, and the second node of the third resistor 134 is configured to receive the second reference voltage Vref2.

The reference voltage generating circuit 140 comprises a fourth resistor 142 and a fifth resistor 144. The fourth resistor 142 comprises a first node and a second node, wherein the first node of the fourth resistor 142 is configured to receive the PWM signal, and the second node of the fourth resistor 142 couples with the inverting input node of the comparator circuit 120. The fifth resistor 144 has a first node and a second node, wherein the first node of the fifth resistor 144 couples with the second node of the fourth resistor 142, and the second node of the fifth resistor 144 is configured to receive the second reference voltage Vref2.

Figure 3:
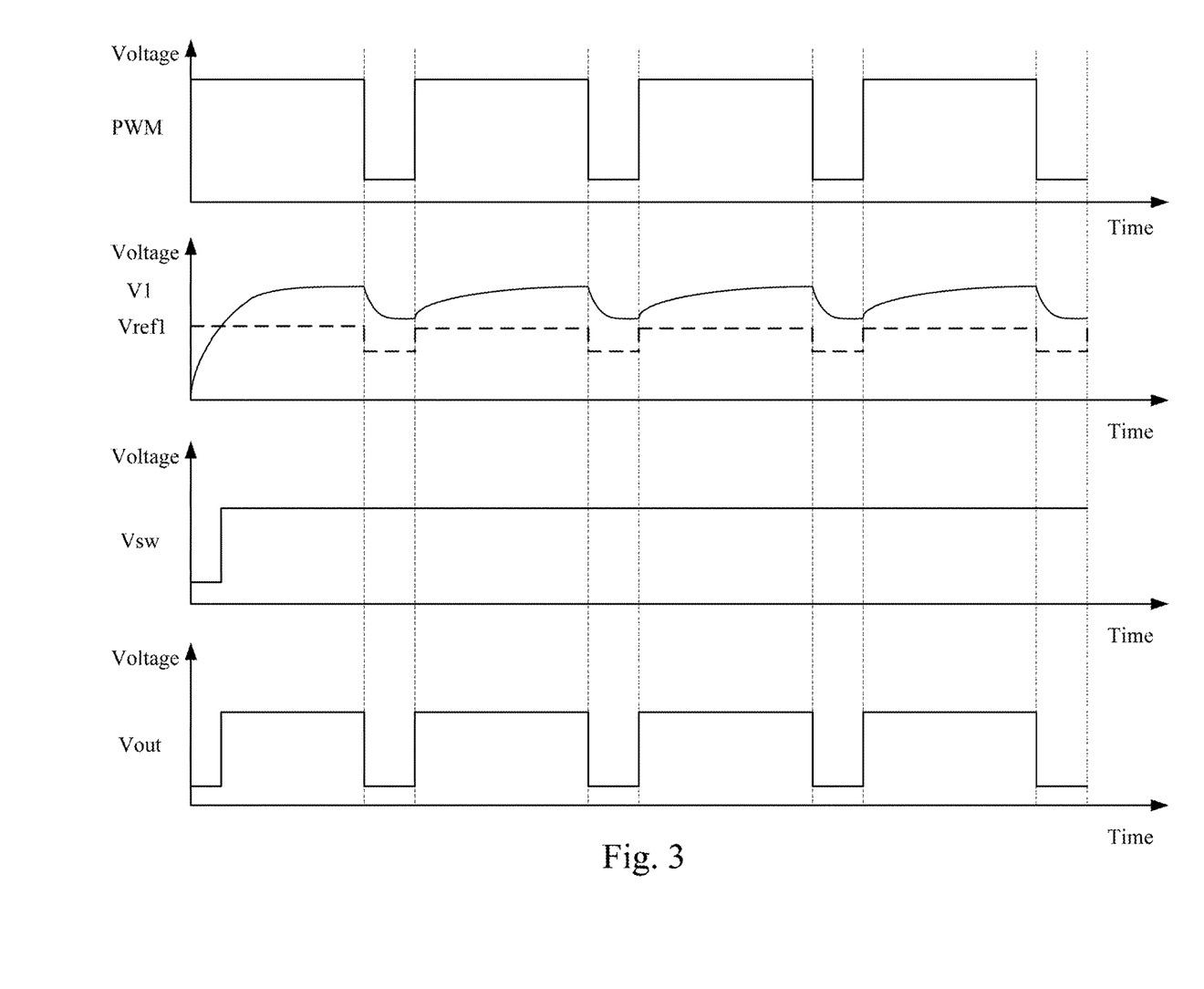
FIG. 3 is a timing diagram for illustrating the operations of the filter circuit of FIG. 1 according to an embodiment of the present disclosure.

Referring to FIGS. 2 and 3, the fourth resistor 142 and the fifth resistor 144 collaboratively divide the voltage difference between the PWM signal and the second reference voltage Vref2, so as to generate the aforesaid first reference voltage Vref1 between the fourth resistor 142 and the fifth resistor 144. Therefore, as shown is FIG. 3, the magnitude of the first reference voltage Vref1 varies correspondingly with the PWM signal.

When the duty ratio of the PWM signal is larger than the aforesaid predetermined threshold value (e.g., larger than 40%), the PWM signal maintains at a higher voltage level for a longer time period. Therefore, the RC circuit 110 may charge the capacitor 116 for the longer time period, and the voltage of the first node of the capacitor 116 (i.e., the ripple voltage V1) is raised to be higher than the first reference voltage Vref1.

On the other hand, the PWM signal maintains at a lower voltage level for a shorter time period, and the first resistor 112 and the second resistor 114 collaboratively reduce the velocity of discharge of the first node of the capacitor 116. Therefore, even when the PWM signal is at the lower voltage level, the ripple voltage V1 would not be lower than the first reference voltage Vref1, wherein the first reference voltage Vref1 had dropped with the PWM signal.

In other words, when the duty ratio of the PWM signal is larger than the predetermined threshold value, the ripple voltage V1 is larger than the first reference voltage Vref1. Once the ripple voltage V1 is larger than the first reference voltage Vref1, the comparator circuit 120 may output the switch signal Vsw to the control node of the output switch 132, wherein the switch signal Vsw is corresponding to the power supply voltage Vdd. Therefore, the output switch 132 is conducted, and the PWM signal is transmitted through the output switch 132 from the first node to the second node. As a result, the output signal Vout outputted by the output control circuit 130 is corresponding to the PWM signal.

Figure 4:
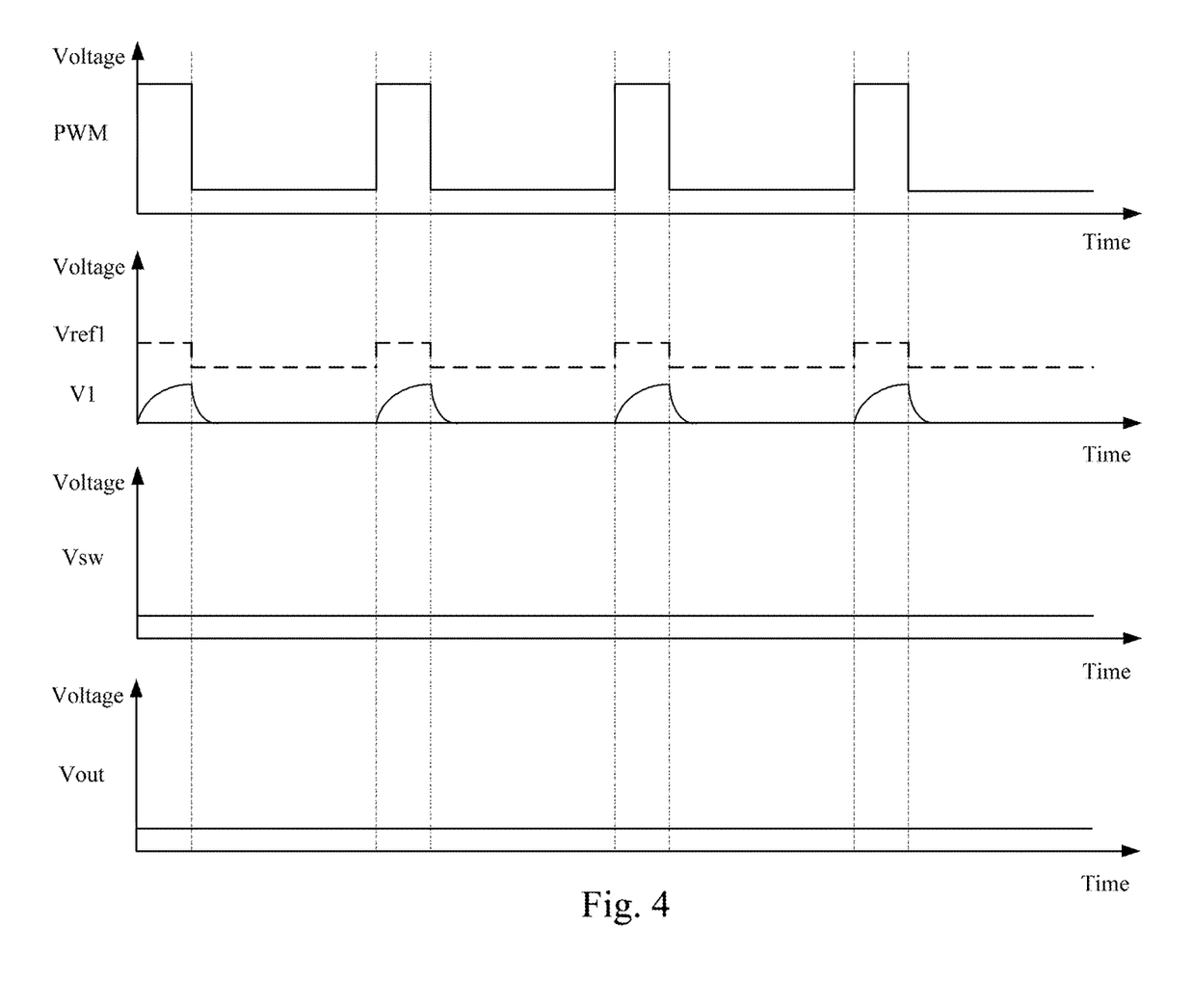
FIG. 4 is another timing diagram for illustrating the operations of the filter circuit of FIG. 1 according to an embodiment of the present disclosure.

Please refer to FIGS. 2 and 4, when the duty ratio of the PWM signal is smaller than the predetermined threshold value, the PWM signal maintains at the higher voltage level for a shorter time period. Therefore, the RC circuit 110 may charge the capacitor 116 for the shorter time period, and the voltage of the first node of the capacitor 116 (e.g., the ripple voltage V1) maintains to be lower than the first reference voltage Vref1.

In other words, when the duty ratio of the PWM signal is smaller than the predetermined threshold value, the ripple voltage V1 is smaller than the first reference voltage Vref1. Once the ripple voltage V1 is smaller than the first reference voltage Vref1, the comparator circuit 120 may output the switch signal Vsw to the control node of the output switch 132, wherein the switch signal Vsw is corresponding to the second reference voltage Vref2. Therefore, the output switch 132 is switched-off, and the PWM signal cannot be transmitted to the second node of the output switch 132. However, the second reference voltage Vref2 is transmitted to the first node of the third resistor 134, so as to make the output signal Vout outputted by the output control circuit 130 to be corresponding to the second reference voltage Vref2.

In practice, the predetermined threshold value can be determined by adjusting the resistance of the first resistor 112 and the second resistor 114 of the filter circuit 100, or by adjusting the capacitance of the capacitor 116.

As can be appreciated form the forgoing descriptions, the filter circuit 100 may filter the PWM signal according to the duty ratio of the PWM signal. Therefore, if there is a secondary stage circuit (not shown in figures) operating based on the output signal Vout of the filter circuit 100, the operation status of the secondary stage circuit can be manipulated by adjusting the duty ratio of the PWM signal.

In an embodiment, for example, the secondary stage circuit may be a light bulb, and the predetermined threshold value of the filter circuit 100 is 40%. When the duty ratio of the PWM signal is lower than 40%, the filter circuit 100 may output the output signal Vout corresponding to the second reference voltage Vref2 to the light bulb. As a result, the light bulb would not be lighted up. When the duty ratio of the PWM signal is 50%, the filter circuit 100 may output the output signal Vout having a 50% duty ratio to the light bulb. As a result, the light bulb would have a normal luminance. When the duty ratio of the PWM signal is 80%, the filter circuit 100 may output the output signal Vout having an 80% duty ratio to the light bulb. As a result, the light bulb would have a high luminance.

Figure 5:
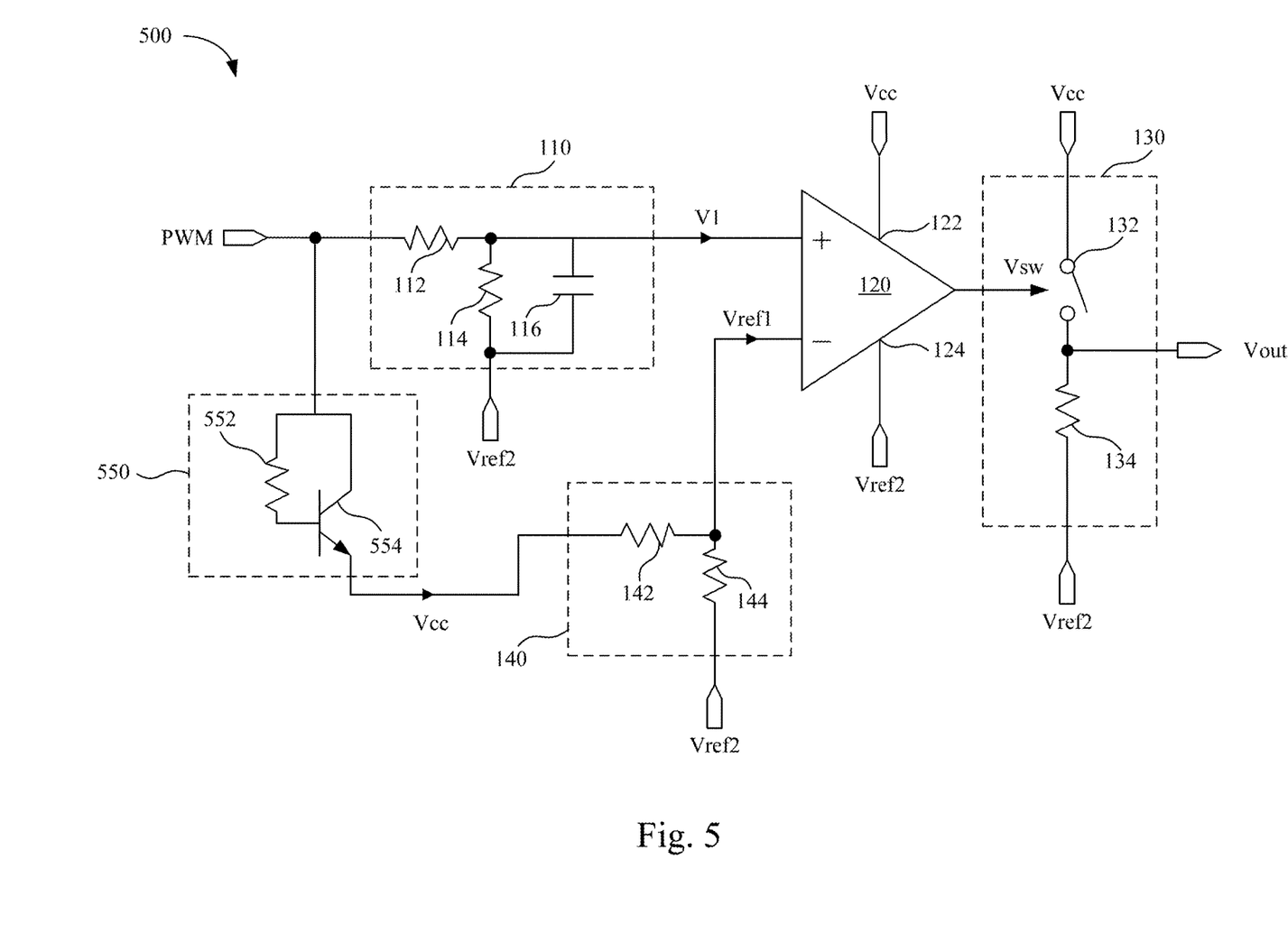
FIG. 5 is a simplified functional block diagram of a filter circuit according to another embodiment of the present disclosure.
Figure 6:
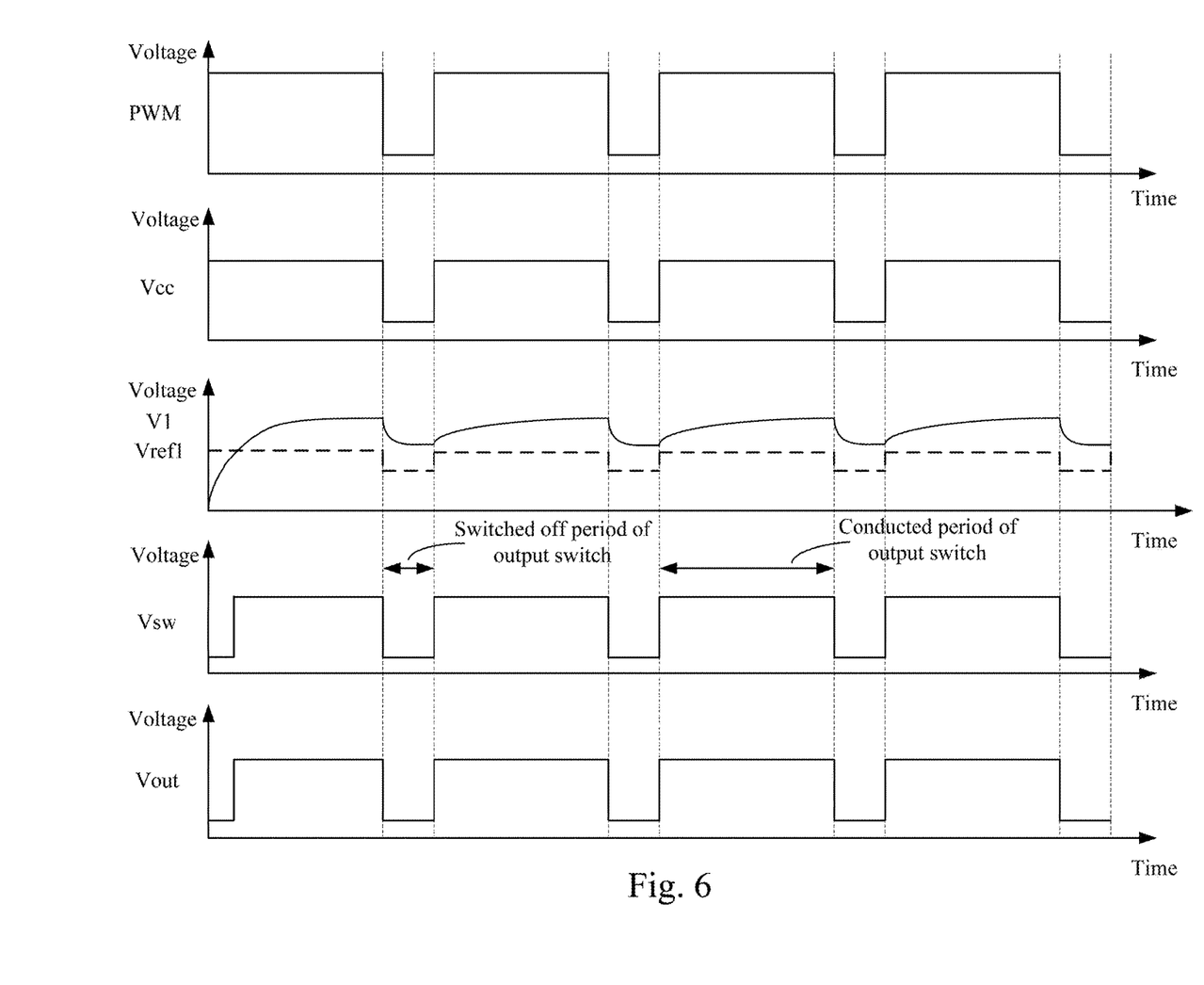
FIG. 6 is a timing diagram for illustrating the operations of the filter circuit of FIG. 5 according to an embodiment of the present disclosure.

FIG. 5 is a simplified functional block diagram of a filter circuit 500 according to another embodiment of the present disclosure. The filter circuit 500 is similar to the filter circuit 100, and the difference is that the filter circuit 500 further comprises a voltage division circuit 550. The voltage division circuit 550 comprises a sixth resistor 552 and an NPN-type transistor 554. The sixth resistor 552 comprises a first node and a second node, wherein the first node of the sixth resistor 552 is configured to receive the PWM signal. The NPN-type transistor 554 comprises a collector, an emitter, and a base. The collector of the NPN-type transistor 554 is configured to receive the PWM signal, the emitter of the NPN-type transistor 554 couples with the output control circuit 130, and the base of the NPN-type transistor 554 couples with a second node of the sixth resistor 552. The NPN-type transistor 554 is configured to generate a voltage-reduction PWM signal Vcc according to the PWM signal, and output the voltage-reduction PWM signal Vcc from the emitter. The voltage-reduction PWM signal Vcc is outputted to the positive power node 122 of the comparator circuit 120, the first node of the fourth resistor 142, and the first node of the output switch 132. The fourth resistor 142 and the fifth resistor 144 collaboratively divide the voltage difference between the voltage-reduction PWM signal Vcc and the second reference voltage Vref2, so as to generate the first reference voltage Vref1 between the fourth resistor 142 and the fifth resistor 144. Therefore, as shown in FIG. 6, the magnitude of the first reference voltage Vref1 varies correspondingly with the voltage-reduction PWM signal Vcc.

The filter circuit 500 needs not to use the power supply voltage Vdd of FIG. 2. Therefore, comparing to the filter circuit 100, applying the filter circuit 500 in a circuit system (not shown in figures) leads to the omission of a circuit for generating the power supply voltage Vdd, so as to reduce the overall circuit area of the circuit system.

The operations of the filter circuit 500 are similar to the operations of the filter circuit 100. That is, when the duty ratio of the PWM signal is larger than the predetermined threshold value, as shown in FIG. 6, the ripple voltage V1 is larger than the first reference voltage Vref1. As a result, the switch signal Vsw outputted by the comparator circuit 120 is corresponding to the voltage-reduction PWM signal Vcc, wherein the voltage-reduction PWM signal Vcc oscillates up and down corresponding to the PWM signal. Therefore, when the duty ratio of the PWM signal is larger than the predetermined threshold value, the output switch 132 of the filter circuit 500 may intermittently conducts or switches off corresponding to the waveforms of the voltage-reduction PWM signal Vcc.

Specifically, when the voltage-reduction PWM signal Vcc equals to a high voltage level, the output switch 132 conducts. As a result, the output signal Vout equals to the high voltage level of the voltage-reduction PWM signal Vcc. When the voltage-reduction PWM signal Vcc equals to a low voltage level, the output switch 132 switches off. As a result, the output signal Vout equals to the second reference voltage Vref2. It is worth mentioning that if the magnitude of the second reference voltage Vref2 is configured to be equal to the low voltage level of the voltage-reduction PWM signal Vcc (e.g., the valley value of the voltage-reduction PWM signal Vcc), the waveform of the output signal Vout would be the same as the waveform of the voltage-reduction PWM signal Vcc.

Figure 7:
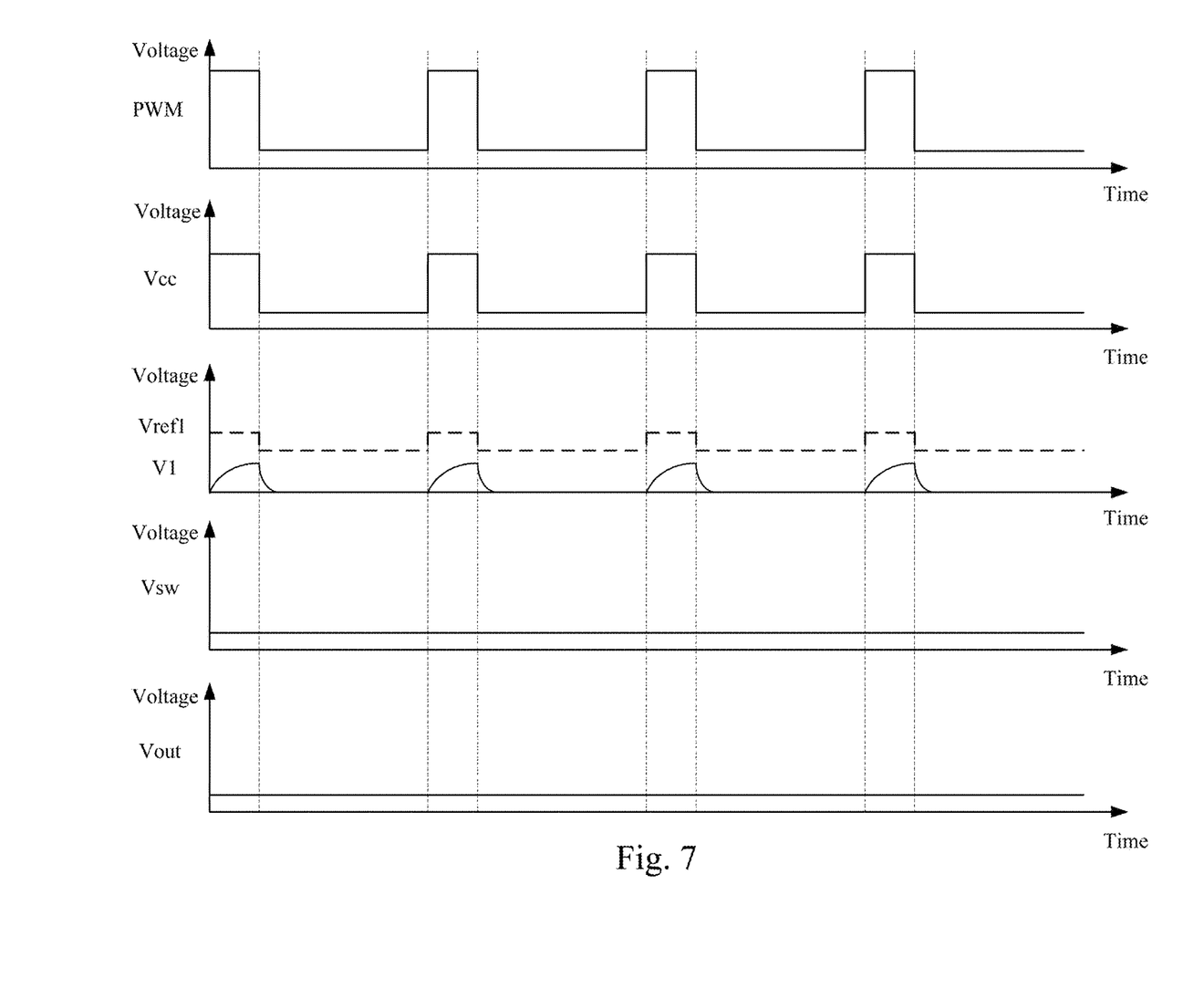
FIG. 7 is another timing diagram for illustrating the operations of the filter circuit of FIG. 5 according to an embodiment of the present disclosure.

On the contrary, as show in FIG. 7, when the duty ratio of the PWM signal is smaller than the predetermined threshold value, the ripple voltage V1 is smaller than the first reference voltage Vref1. As a result, the switch signal Vsw outputted by the comparator circuit 120 is corresponding to the second reference voltage Vref2, and the output switch 132 is switched off to make the output signal Vout to be corresponding to the second reference voltage Vref2.

Figure 8:
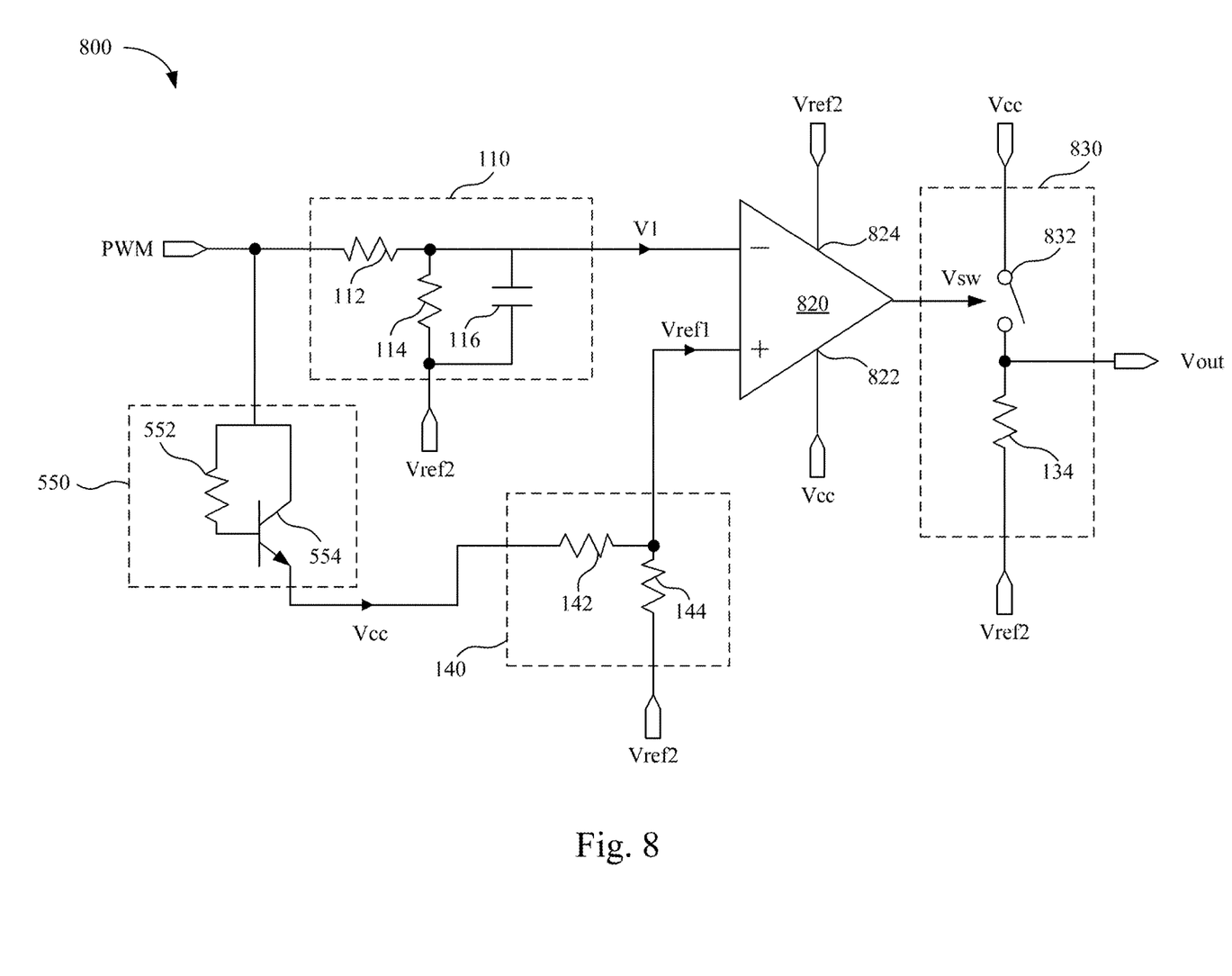
FIG. 8 is a simplified functional block diagram of a filter circuit according to yet another embodiment of the present disclosure.

FIG. 8 is a simplified functional block diagram of a filter circuit 800 according to yet another embodiment of the present disclosure. The filter circuit 800 is similar to the filter circuit 500, the difference is that the comparator circuit 820 of the filter circuit 800 couples with the reference voltage generating circuit 140 by the non-inverting input node, and couples with the RC circuit 110 by the inverting input node. The comparator circuit 820 uses the positive power node 822 and the negative power node 824 to receive the voltage-reduction PWM signal Vcc and the second reference voltage Vref2, respectively. In addition, the output switch 832 of the output control circuit 830 is configured to conduct while the control node of the output switch 832 receives a lower voltage level, and to switch off while the control node of the output switch 832 receives a higher voltage level.

Figure 9:
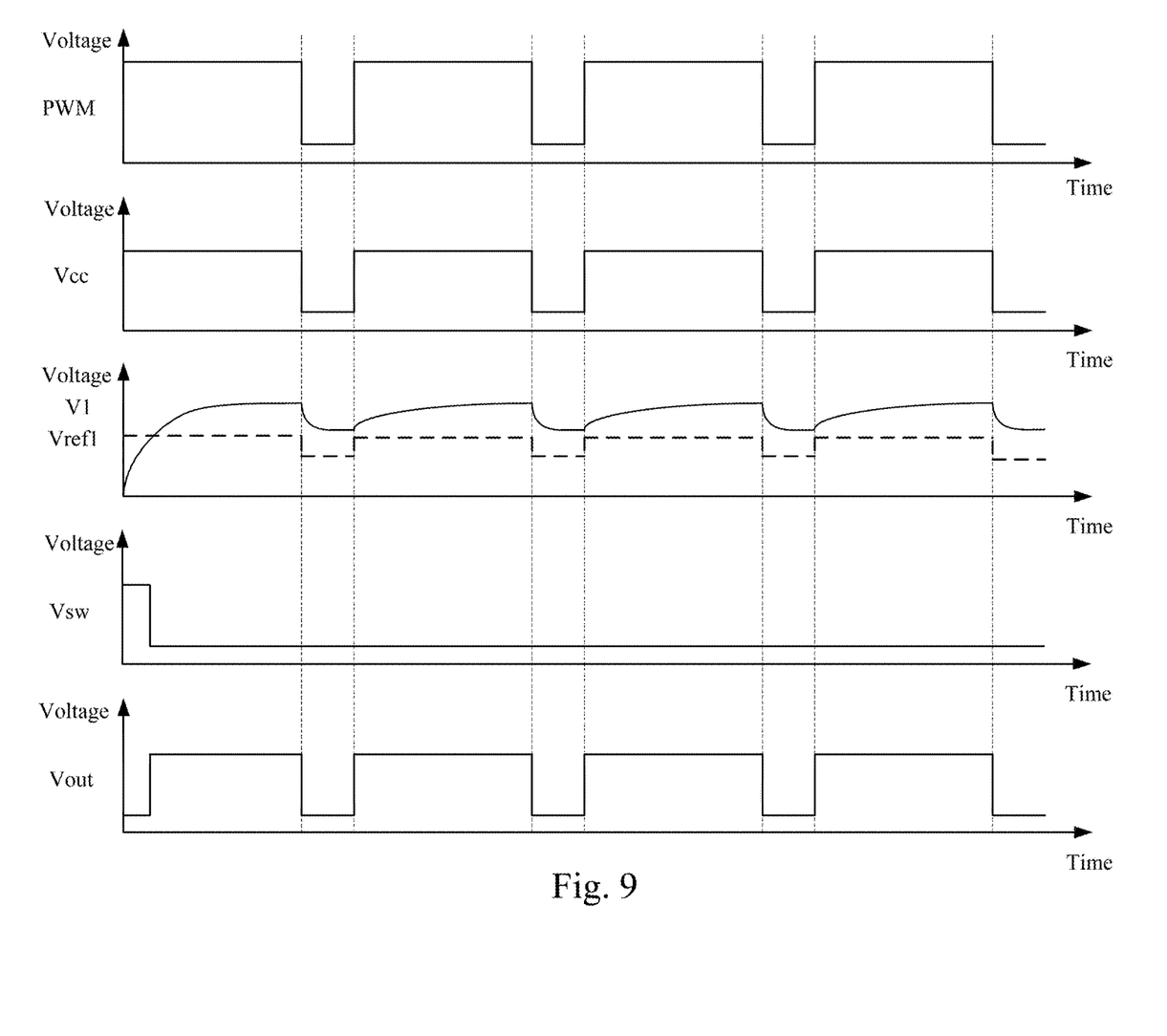
FIG. 9 is a timing diagram for illustrating the operations of the filter circuit of FIG. 8 according to an embodiment of the present disclosure.

Specifically, as shown in FIG. 9, when the duty ratio of the PWM signal is larger than the predetermined threshold value, the ripple voltage V1 is higher than the first reference voltage Vref1. As a result, the comparator circuit 820 may output the switch signal Vsw, which is corresponding to the second reference voltage Vref2. Therefore, the output switch 832 conducts, and the output control circuit 830 outputs the output signal Vout which is corresponding to the voltage-reduction PWM signal Vcc.

Figure 10:
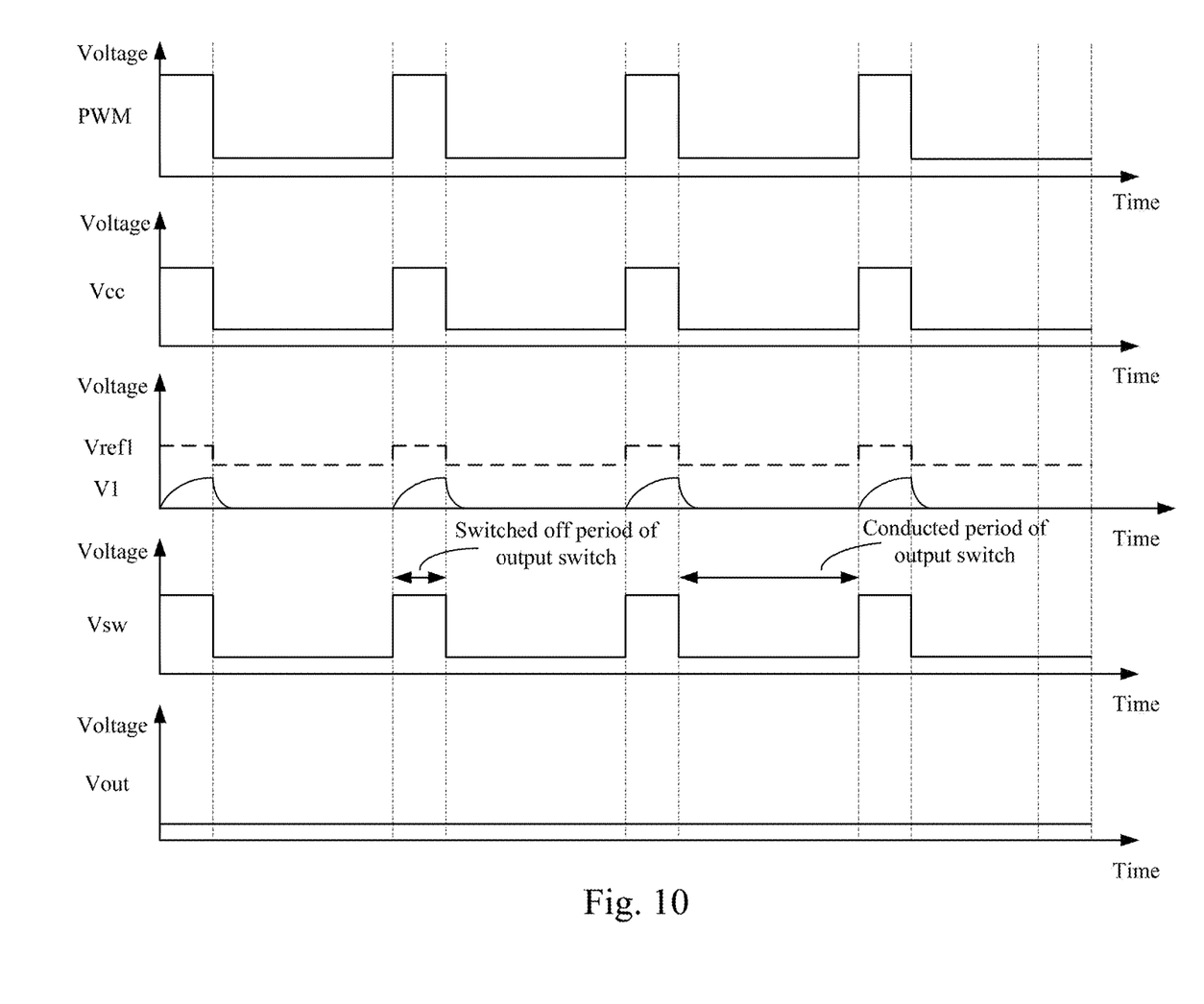
FIG. 10 is another timing diagram for illustrating the operations of the filter circuit of FIG. 8 according to an embodiment of the present disclosure.

On the contrary, as shown in FIG. 10, when the duty ratio of the PWM signal is smaller than the predetermined threshold value, the comparator circuit 820 may output the switch signal Vsw which is corresponding to the voltage-reduction PWM signal Vcc. As a result, the output switch 832 switches on and off intermittently. In specific, when the voltage-reduction PWM signal Vcc equals to a high voltage level (e.g., the peak value of the voltage-reduction PWM signal Vcc), the output switch 832 switches off and the output signal Vout is corresponding to the second reference voltage Vref2. When the voltage-reduction PWM signal Vcc equals to a low voltage level (e.g., the valley value of the voltage-reduction PWM signal Vcc), the output switch 832 conducts and the output signal Vout is corresponding to the low voltage level of the voltage-reduction PWM signal Vcc (e.g., the valley value of the voltage-reduction PWM signal Vcc).

Accordingly, when the duty ratio of the PWM signal is smaller than the predetermined threshold value, even if the output switch 832 switches on and off intermittently, the output signal Vout remains equal to a constant low voltage (e.g., the second reference voltage Vref2) and will not vary with the PWM signal.

Figure 11:
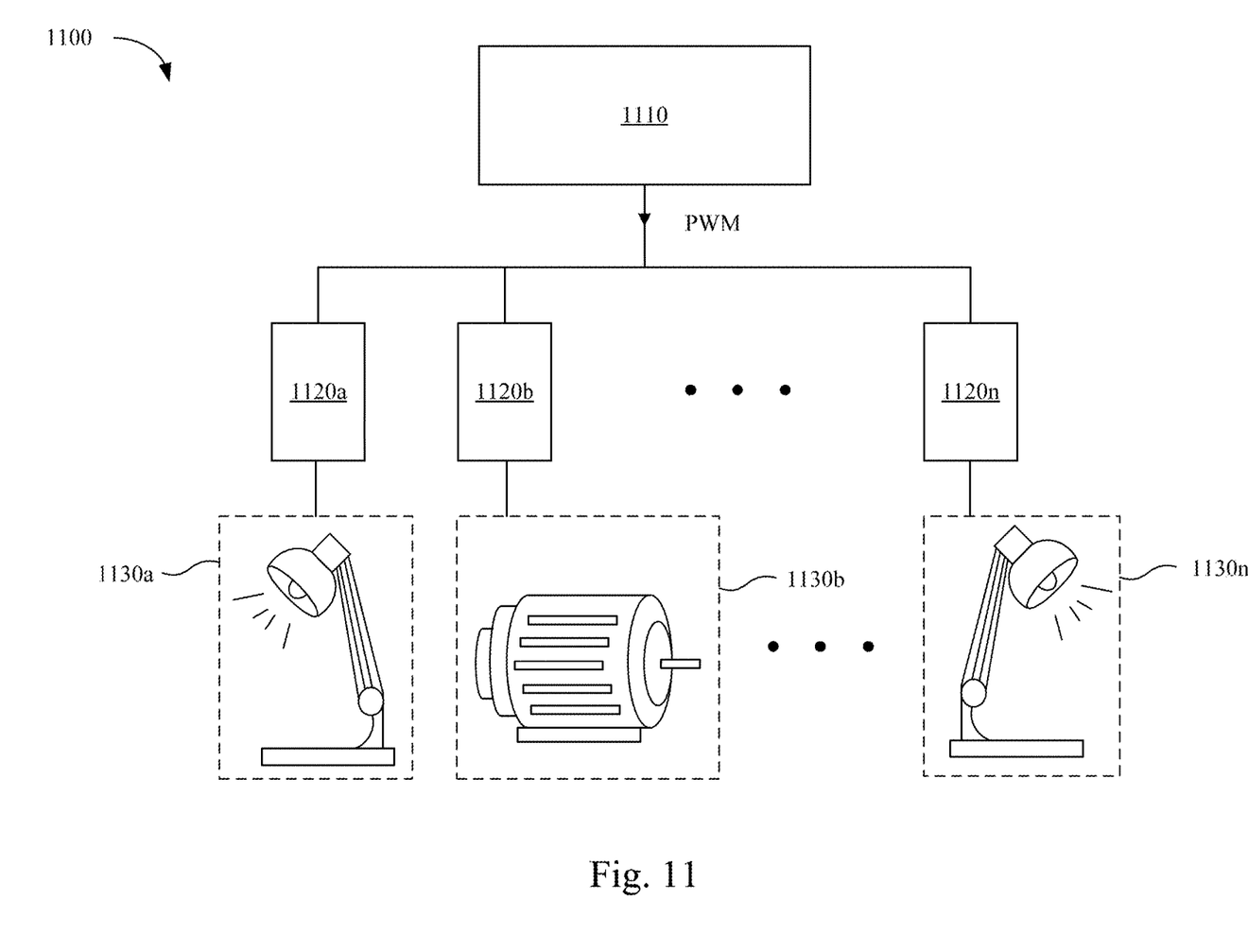
FIG. 11 is a simplified functional block diagram of a control system according to an embodiment of the present disclosure.

FIG. 11 is a simplified functional block diagram of a control system 1100 according to an embodiment of the present disclosure. The control system 1100 is a one to many control system using the aforementioned filter circuit 100, 500, or 800 to realize multiple control outputs based on a single input. The control system 1100 comprises a control device 1110, multiple control filter circuits 1120a~1120n, and multiple output devices 1130a~1130n. The filter circuits 1120a~1120n all couple with the control device 1110, and each of the output devices 1130a~1130n correspondingly couples with one of the filter circuits 1120a~1120n, wherein each of the filter circuits 1120a~1120n may be aforementioned filter circuit 100, 500 or 800.

Throughout the specification and drawings, indexes a~n may be used in the reference numbers of components and devices for ease of referring to respective components and devices. The use of indexes a~n does not intend to restrict the amount of components and devices to any specific number. In the specification and drawings, if a reference number of a particular component or device is used without having the index, it means that the reference number is used to refer to any unspecific component or device of corresponding component group or device group. For example, the reference number 112a is used to refer to the specific filter circuit 1120a, and the reference number 1120 is used to refer to any unspecific filter circuit of the filter circuits 1120a~1120n. In another example, the reference number 130a is used to refer to the specific output device 1130a, and the reference number 1130 is used to refer to any unspecific output device of the output devices 1130a~1130n.

The control device 1110 is configured to generate the PWM signal, and to determine the duty ratio of the PWM signal. The multiple filter circuits 1120a~1120n is configured to receive and filter the PWM signal. The multiple output devices 1130a~1130n is configured to operate according to the received PWM signal.

In specific, each of the filter circuits 1120a~1120n has a predetermined threshold value, wherein the respective predetermined threshold values of each filter circuits 1120a~1120n may be the same as or different from each other. When a filter circuit 1120 of the multiple the filter circuits 1120a~1120n receives the PWM signal having a duty ratio larger than the predetermined threshold value, the filter circuit 1120 may output the PWM signal to an output device 1130 correspondingly coupled with the filter circuit 1120. When the filter circuit 1120 receives the PWM signal having a duty ratio smaller than the predetermined threshold value, the filter circuit 1120 may not transmit the PWM signal to the output device 1130 correspondingly coupled with the filter circuit 1120. Therefore, the control system 1100 may control the operation status of the output devices 1130a~1130 by determining the duty ratio of the PWM signal.

In an embodiment, for example, the output device 1130a may be a first lamp, the output device 1130b may be a direct current motor (DC motor), and the output device 1130n may be a second lamp. The filter circuit 1120a, 1120b and 1120n may be filter circuits 100, 500, and 800, respectively. The filter circuit 100 couples with the first lamp 1130a, the filter circuit 500 couples with the DC motor 1130b, and the filter circuit 800 couples with the second lamp 1120n, wherein the filter circuits 100, 500, and 800 have predetermined threshold values of 20%, 40%, and 60%, respectively. When the PWM signal outputted by the control device 1110 having a 30% duty ratio, the first lamp 1130a may have a weak luminance, the DC motor 1130b is in an switched off status, and the second lamp 1130n is in an un-lighted status. Then, when the PWM signal outputted by the control device 1110 having a 50% duty ratio, the first lamp 1130a may have a normal luminance, the DC motor 1130b is in an operating status, and the second lamp 1130n remains in the un-lighted status. When the PWM signal outputted by the control device 1110 having a 70% duty ratio, the first lamp 1130a and the second lamp 1130n have high luminance, and the DC motor 1130b operates in high rotation speed.

As can be appreciated from the foregoing descriptions, the filter circuits 100, 500, and 800 and the control system 1100 need not to use any specific control IC, and can filter the PWM signal according to the duty ratio of the PWM signal by simple circuits.

In addition, the filter circuits 100, 500, and 800 and the control system 1100 provide solutions for the problem that the traditional filter circuit cannot distinguish PWM signals with different duty ratios. Therefore, the filter circuits 100, 500, and 800 and the control system 1100 facilitate the usage of the PWM signal.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A filter circuit suited for filtering a PWM signal, comprising:
   a resistor-capacitor (RC) circuit, configured to generate a ripple voltage according to the PWM signal;
   a comparator circuit, coupled with the RC circuit, configured to compare the ripple voltage with a first reference voltage, and to output a switch signal according to a comparison result; and
   an output control circuit, coupled with the comparator circuit and the RC circuit, configured to generate an output signal according to the switch signal and the PWM signal;
   wherein when a duty ratio of the PWM signal is larger than a predetermined threshold value, a waveform of the output signal is corresponding to the PWM signal, and when the duty ratio of the PWM signal is smaller than the predetermined threshold value, the waveform of the output signal is not corresponding to the PWM signal.

2. The filter circuit of claim 1, wherein the RC circuit comprises:
   a first resistor, comprising a first node and a second node, wherein the first node is configured to receive the PWM signal;
   a second resistor, comprising a first node and a second node, wherein the first node of the second resistor couples with the second node of the first resistor, and the second node of the second resistor is configured to receive a second reference voltage; and
   a capacitor, comprising a first node and a second node, wherein the first node of the capacitor couples with the second node of the first resistor and the comparator circuit, and the second node of the capacitor is configured to receive the second reference voltage.

3. The filter circuit of claim 1, wherein the output control circuit comprises:
   an output switch, comprising a first node, a second node, and a control node, wherein the first node of the output switch is configured to receive the PWM signal, the second node of the output switch is configured to generate the output signal, and the control node of the output switch is configured to receive the switch signal; and
   a third resistor, comprising a first node and a second node, wherein the first node of the third resistor couples with the second node of the output switch, and the second node of the third resistor is configured to receive a second reference voltage.

4. The filter circuit of claim 3, wherein a non-inverting input node of the comparator circuit is configured to receive the ripple voltage, an inverting input node of the comparator circuit is configured to receive the first reference voltage, and when the ripple voltage is larger than the first reference voltage, the output switch is in a conducting state.

5. The filter circuit of claim 3, wherein a non-inverting input node of the comparator circuit is configured to receive the first reference voltage, an inverting input node of the comparator circuit is configured to receive the ripple voltage, and when the ripple voltage is larger than the first reference voltage, the output switch is in a conducting state.

6. The filter circuit of claim 4, further comprising:
   a reference voltage generating circuit, couples with the inverting input node of the comparator circuit, and configured to generate the first reference voltage according to the PWM signal and a second reference voltage.

7. The filter circuit of claim 1, further comprising:
   a voltage division circuit, configured to reduce magnitude of the PWM signal to generate a voltage-reduction PWM signal, and for outputting the voltage-reduction PWM signal to the output control circuit;
   wherein the output control circuit is configured to generate the output signal according to the switch signal and the voltage-reduction PWM signal.

8. The filter circuit of claim 7, wherein the comparator circuit comprises a positive power node and a negative power node, the positive power node couples with the voltage division circuit and is configured to receive the voltage-reduction PWM signal, and the negative power node is configured to receive a second reference voltage.

9. A control system, comprising:
   a control device, configured to generate a PWM signal;
   multiple filter circuits, configured to couple with the control device, wherein each of the multiple filter circuits is configured to receive and filter the PWM signal; and
   multiple output devices, wherein each of the multiple output devices is configured to correspondingly couple with one of the multiple filter circuits, and to conduct operations according to the PWM signal;
   wherein each of the multiple filter circuits has a predetermined threshold value, the filter circuit compares a duty ratio of the PWM signal with the predetermined threshold value, when the duty ratio of the PWM signal is larger than the predetermined threshold value, the filter circuit outputs the PWM signal to one of the multiple output devices correspondingly couples with the filter circuit, and when the duty ratio of the PWM signal is smaller than the predetermined threshold value, the filter circuit does not output the PWM signal to the one of the multiple output devices correspondingly couples with the filter circuit.

10. The control system of claim 9, wherein each of the multiple filter circuits comprises:
    a RC circuit, configured to generate a ripple voltage according to the PWM signal;
    a comparator circuit, coupled with the RC circuit, configured to compare the ripple voltage with a first reference voltage, and to output a switch signal according to a comparison result; and
    an output control circuit, coupled with the comparator circuit and the RC circuit, configured to generate an output signal according to the switch signal and the PWM signal;
    wherein when the duty ratio of the PWM signal is larger than the predetermined threshold value, a waveform of the output signal is corresponding to the PWM signal, and when the duty ratio of the PWM signal is smaller than the predetermined threshold value, the waveform of the output signal is not corresponding to the PWM signal.

* * * * *